United States Patent [19]

Wald et al.

[11] Patent Number: 5,030,587

[45] Date of Patent: Jul. 9, 1991

[54] METHOD OF FORMING SUBSTANTIALLY PLANAR DIGIT LINES

[75] Inventors: Phillip G. Wald; Pierre Fazan, both of Boise, Id.

[73] Assignee: Micron Technology, Inc., Boise, Id.

[21] Appl. No.: 534,126

[22] Filed: Jun. 5, 1990

[51] Int. Cl.⁵ .............................................. H01L 21/70
[52] U.S. Cl. ........................................ 437/52; 437/47; 437/190; 437/193; 437/195; 437/228
[58] Field of Search .................... 437/52, 47, 190, 193, 437/195, 228

[56] References Cited

U.S. PATENT DOCUMENTS

| | | | |
|---|---|---|---|
| 4,829,025 | 5/1989 | Iranmanesh | 437/228 |
| 4,849,369 | 7/1989 | Jeuch et al. | 437/195 |
| 4,868,138 | 9/1989 | Chan et al. | 437/195 |
| 4,871,688 | 10/1989 | Lowrey | 437/228 |
| 4,957,881 | 9/1990 | Crotti | 437/195 |
| 4,961,822 | 10/1990 | Liao et al. | 437/228 |

OTHER PUBLICATIONS

Shibata et al., "High Performance Half-Micron PMOS-FETs with 0.1 μm Shallow p+n Junction Utilizing Selected Silicon Growth and Rapid Thermal Annealing", IEDM, 1987, pp. 590-593.
S Wolf and RN Tauber, *"Silicon Processing from the VLSI Era"*, vol. 1, Lattice Press, Sunset Beach, 1986, p. 124.

*Primary Examiner*—Brian E. Hearn
*Assistant Examiner*—Laura M. Holtzman
*Attorney, Agent, or Firm*—Wells, St. John & Roberts

[57] ABSTRACT

A method of forming digit lines on a semiconductor wafer having integrated circuits comprises the following consecutive steps:

selectively processing the wafer to produce a desired array of dynamic random access memory cells having associated word lines and exposed active areas, the word lines being defined by electrically conductive regions comprised of a polysilicon/high conductive material sandwich structure and having side and top electrically insulated regions comprised of oxide;

providing a layer of doped epitaxial monocrystalline silicon atop exposed active areas to a height which is below the uppermost portions of the electrically insulated regions atop the word lines, and above the height of the uppermost portions of the word line electrically conductive regions;

providing a layer of electrically insulating oxide atop the wafer, the electrically insulating layer having a lowest point which is higher than the height of the doped epitaxial silicon layer;

planarizing the electrically insulating layer by removing electrically insulating material to provide a substantially planar upper layer of electrically insulating material at a height which is substantially coincident with a common height of the uppermost portions of the tops of the electrically insulated regions of the word lines;

etching vias into the electrically insulating layer which generally align with doped epitaxial silicon;

depositing an electrically conductive doped polysilicon layer atop the planarized and etched electrically insulating oxide layer; and etching the doped polysilicon layer to form desired substantially planar digit lines.

1 Claim, 6 Drawing Sheets

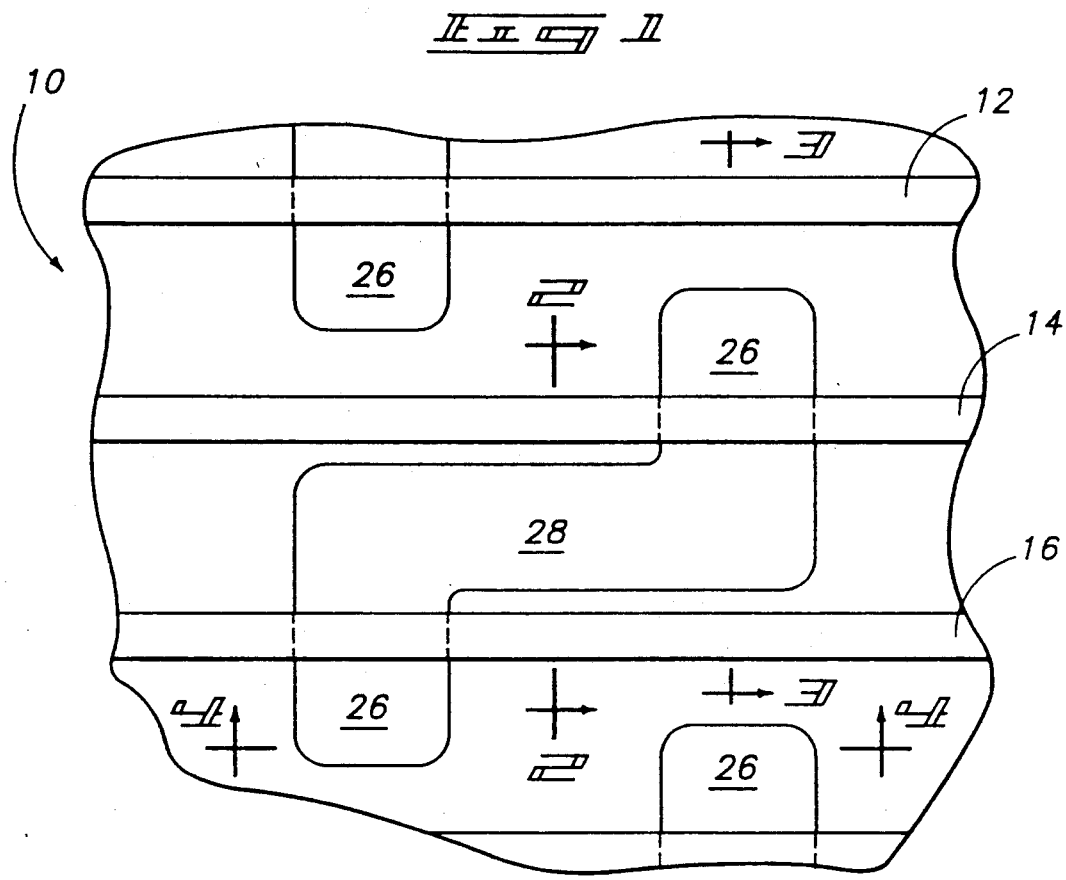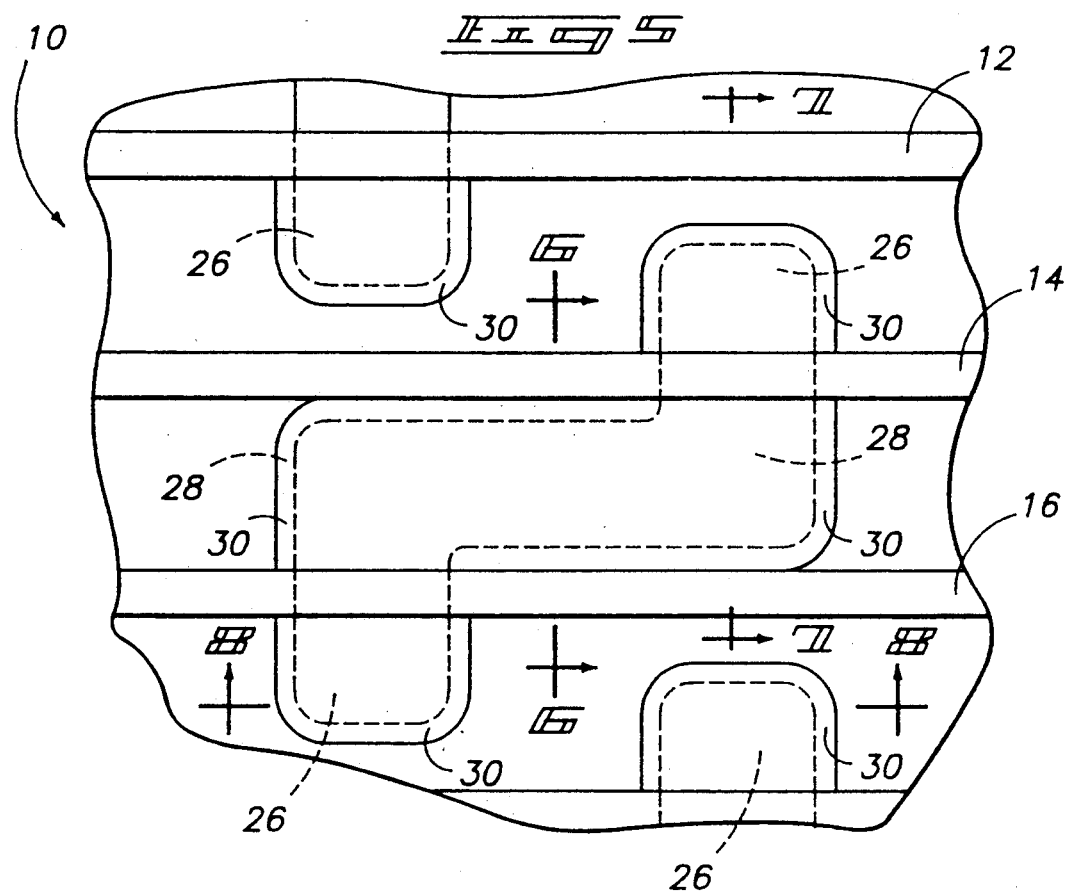

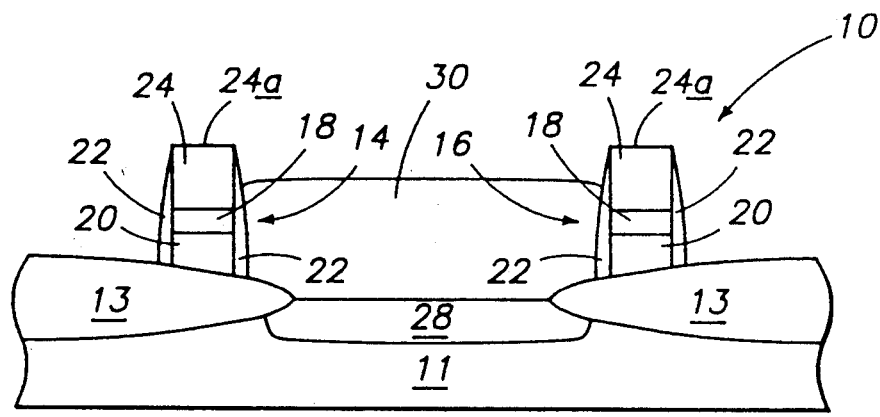
$\mathbb{F}$ $\mathbb{I}$ $\mathbb{G}$ $\mathbb{G}$
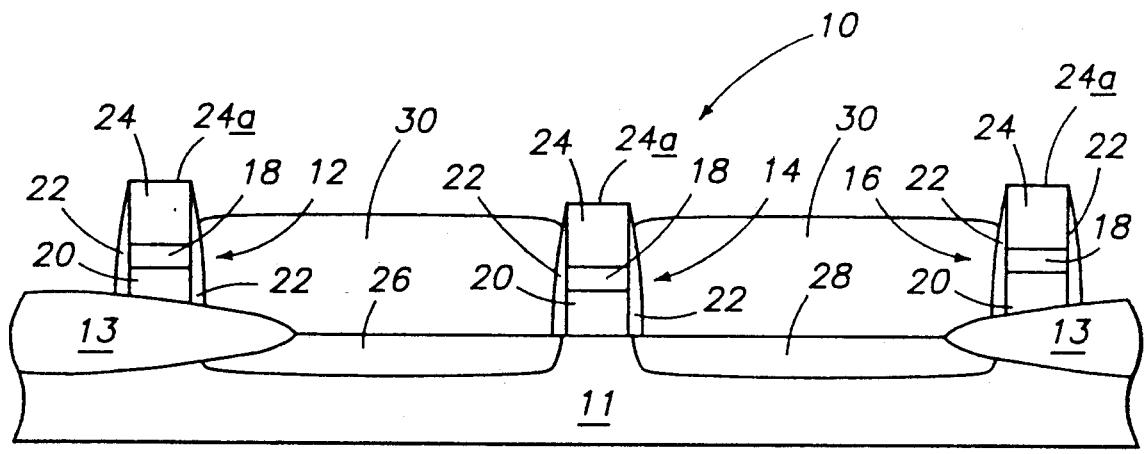
$\mathbb{F}$ $\mathbb{I}$ $\mathbb{G}$ $\mathbb{7}$
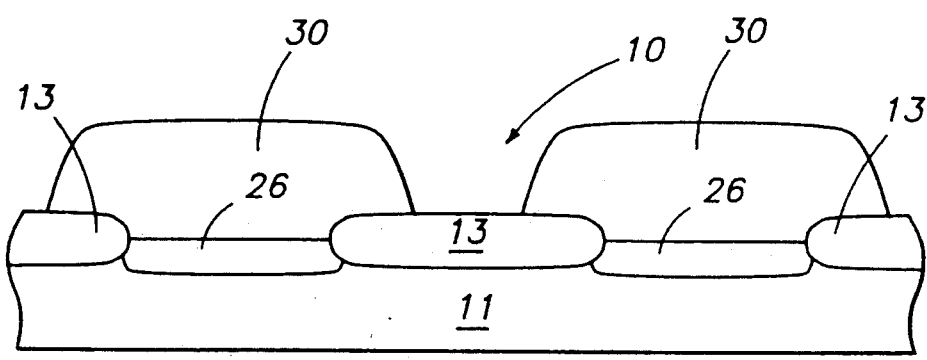
$\mathbb{F}$ $\mathbb{I}$ $\mathbb{G}$ $\mathbb{8}$

5,030,587

METHOD OF FORMING SUBSTANTIALLY PLANAR DIGIT LINES

TECHNICAL FIELD

This invention relates generally to formation of digit or bit lines on semiconductor wafers for integrated circuits formed in an array of memory cells. It also relates to devices or circuits where overlapping interconnections are made over topography.

BACKGROUND OF THE INVENTION

It is desirable to minimize resistance and parasitic capacitance in the digit lines of memory arrays in semiconductor integrated circuits. Typically existing digit lines in memory arrays follow an up and down topography over the word lines for contact with the active areas of devices. This serpentine path increases the distance over which current must travel, thereby increasing the line resistance and the parasitic capacitance with surrounding layers. Futher, this curved topography creates problems of step coverage, conformality and definition of subsequently deposited layers on the wafer. In particular, the etch of a digit line that follows highly curved topography is somewhat difficult and creates a tendency for conductive poly stringers to form between adjacent digit lines causing a short. To avoid these stingers, a long overetch is needed. However, overetch results in notching of the digit line and thereby increases digit line resistance further.

It would be desirable to develop a method which reduces digit line resistance as well as these other problems.

BRIEF DESCRIPTION OF THE DRAWINGS

The preferred embodiment of the invention is discussed below and with reference to the accompanying drawings, in which:

FIG. 1 is a top plan diagrammatic view of a portion of a substrate wafer at one step in a processing method in accordance with the invention.

FIG. 5 is a top diagrammatic plan view of a portion of a substrate wafer at a processing step subsequent to that illustrated by FIG. 1 using a processing method in accordance with the invention.

FIG. 6 is a partial diagrammatic section taken through line 6—6 in FIG. 5.

FIG. 7 is a partial diagrammatic section taken through line 7—7 in FIG. 5.

FIG. 8 is a full diagrammatic section taken through line 8—8 in FIG. 5.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

In accordance with the invention, a method of forming digit lines on a semiconductor wafer having integrated circuits comprises the following steps:

selectively processing the wafer (by depositing and patterning different conductive insulating layers, and by doping) to produce a desired array of memory cells having associated word lines and having exposed active areas, the word lines being defined by an electrically conductive region and having side, bottom and top electrically insulated regions;

providing a layer of doped silicon atop the exposed active areas providing a layer of doped epitaxial monocrystalline silicon atop the exposed active areas to a height which is everywhere below the uppermost portions of the electrically insulated regions atop the word lines, and everywhere above the height of the uppermost portions of the word line electrically conductive regions;

providing a layer of electrically insulating oxide atop the wafer, the electrically insulating layer having a lowest height which is higher than the height of the doped silicon layer;

planarizing the electrically insulating layer by removing electrically insulating material to provide a substantially planar upper surface of electrically insulating material at a height which is substantially coincident with a common height of the uppermost portions of the tops of the electrically insulated regions of the word lines;

etching vias into the electrically insulating layer which generally align with doped epitaxial silicon;

depositing an electrically conductive doped polysilicon layer atop the planarized and etched electrically insulating oxide layer; and etching the electrically conductive layer to form desired substantially planar digit lines.

Figure 11:
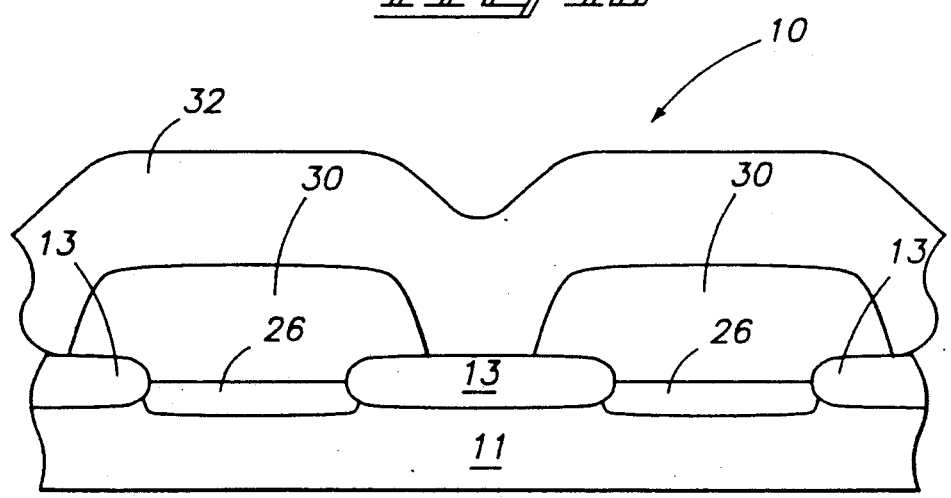
Figure 12:
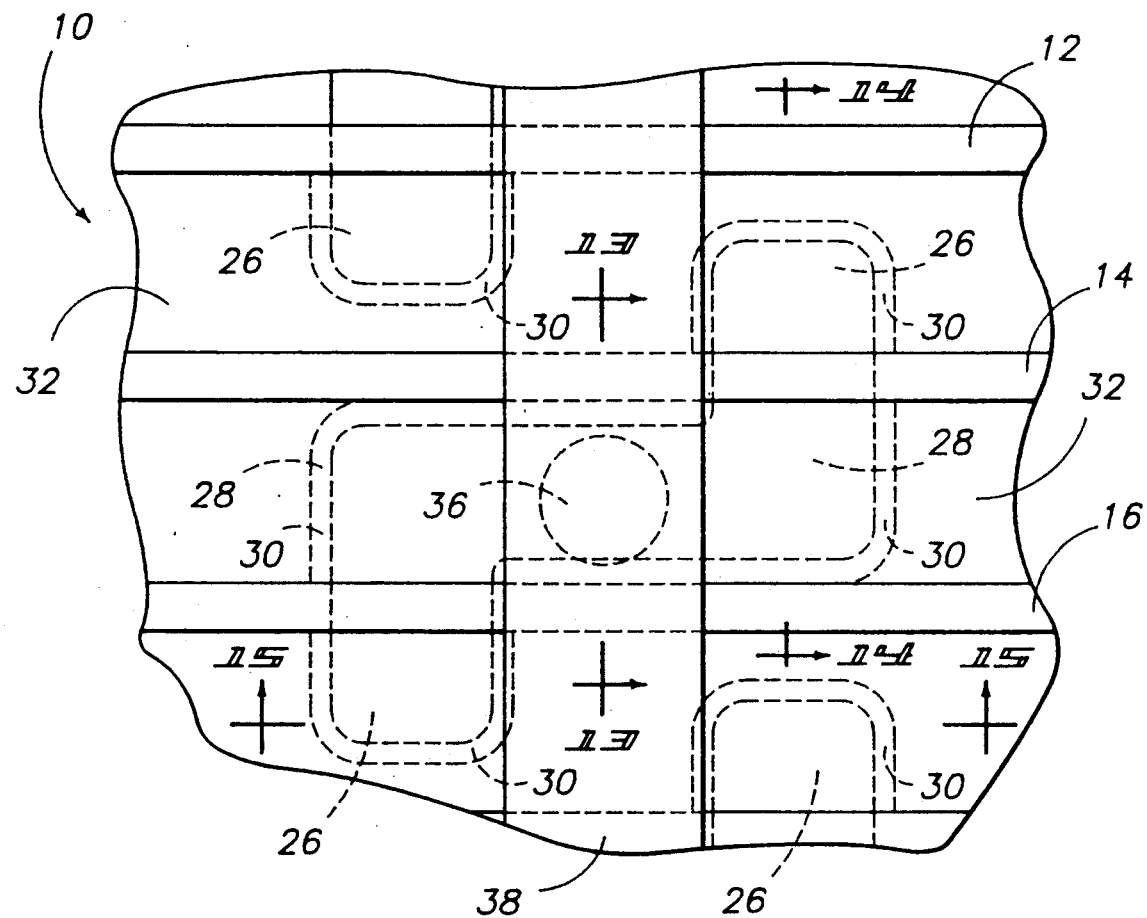
FIG. 12 is a top diagrammatic plan view of a portion of a substrate wafer at still a further subsequent processing step using a processing method in accordance with the invention.

More particularly, FIGS. 1-15 diagrammatically illustrate processing of a semiconductor wafer in accordance with the invention FIGS. 1, 5 and 12 are sequential partial top views of a portion of a wafer processed sequentially in accordance with the invention. The intervening figures are cross-sectional views as described in the Brief Description of Drawings section above. Common numerals are used in the description that follows and throughout the sequential figures to indicate the common areas.

Referring to the figures, a semiconductor wafer having integrated circuits formed in part therein is indicated generally by reference numeral 10. FIG. 1 illustrates one portion of a silicon wafer that has been selectively processed to begin formation of an array of dynamic random access memory cells.

Referring specifically to FIGS. 1-4, wafer portion 10 is comprised of a doped substrate 11 having word lines 12, 14, and 16 formed thereon. Areas of field oxide 13 have previously been selectively provided as indicated. Each word line 12, 14, and 16 has an electrically conductive region comprised of a layered structure of WSi$_x$ 18 and an underlying layer of polysilicon 20. Each also has side and top electrically insulating regions 22, 24 respectively, comprised of SiO$_2$. Of course, other conductive or insulating materials can be used: for example, TiSi$_2$, Al, W for conductive, Si$_3$N$_4$ for insulating. The word lines are also electrically insulated beneath their lowestmost portions by field oxide 13 or the gate oxide. (The conventional gate oxide layer is not shown in the figures) Upon formation of word lines 12, 14 and 16, implant steps are performed to dope exposed active areas 26 and 28.

Referring next to FIGS. 5-8, plugs 30 of epitaxial silicon are preferentially grown in the vertical direction on the exposed active areas. Doped epitaxial silicon application is used because of its higher inherent conductivity, and the ability to minimize the number of processing steps, as compared to metal application or polysilicon application. growth of In the illustrated embodiment, epitaxial silicon plugs 30 are provided to a height which is below the highest portions 24a of the electrically insulated regions 24 above word lines 12, 14 and 16. Word lines 12, 14, and 16 follow a somewhat serpentine path up and down over the field oxide and the gate areas on the substrate. As such, the elevation of uppermost portions 24a fluctuates in a regular manner across the wafer, as evidenced by the height of word line 14 to that of word lines 12 and 16. (FIG. 7).

Plugs 30 are also provided to a height which is everywhere above the position of the uppermost portions of the word line electrically conductive regions, which in the illustrated embodiment would be the uppermost portions of WSi$_x$ layers 18. This will provide an added margin of safety in the event of mask misalignment in a subsequent step. In the event of such misalignment, the added height of silicon material provides a margin of error to assist in avoiding etching a misaligned contact to the point of creating electrical contact between a word line and a digit line.

Figure 2:
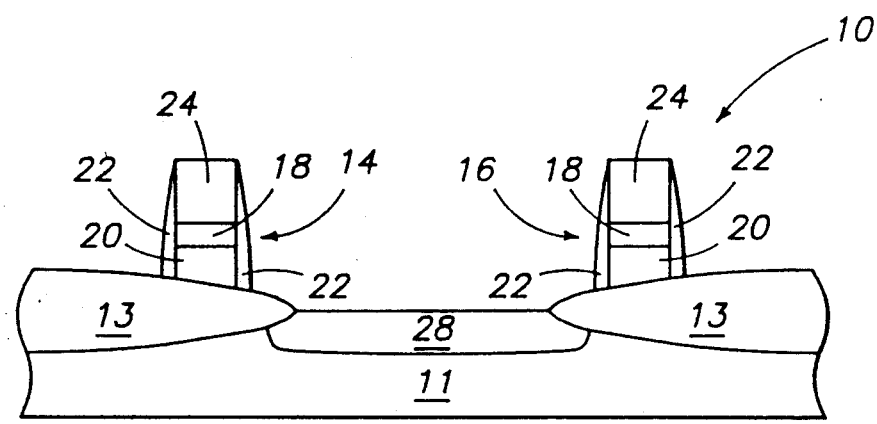
FIG. 2 is a partial diagrammatic section taken through line 2—2 in FIG. 1.
Figure 3:
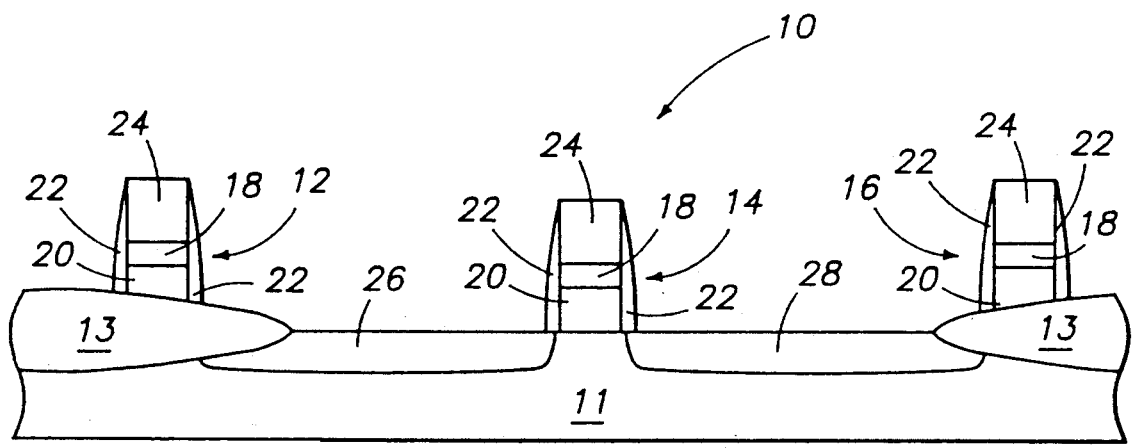
FIG. 3 is a partial diagrammatic section taken through line 3—3 in FIG. 1.
Figure 4:
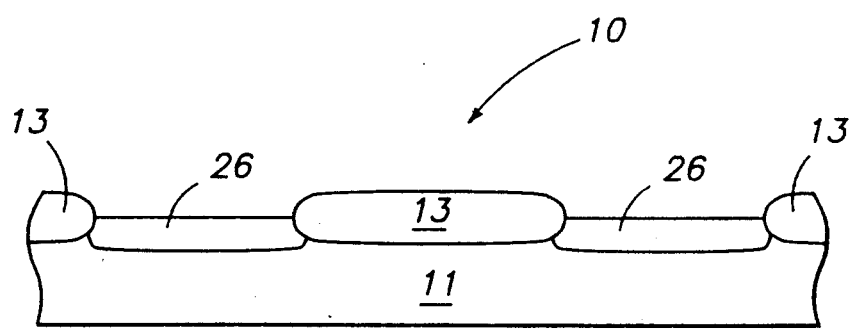
FIG. 4 is a full diagrammatic section taken through line 4—4 in FIG. 1.
Figure 9:
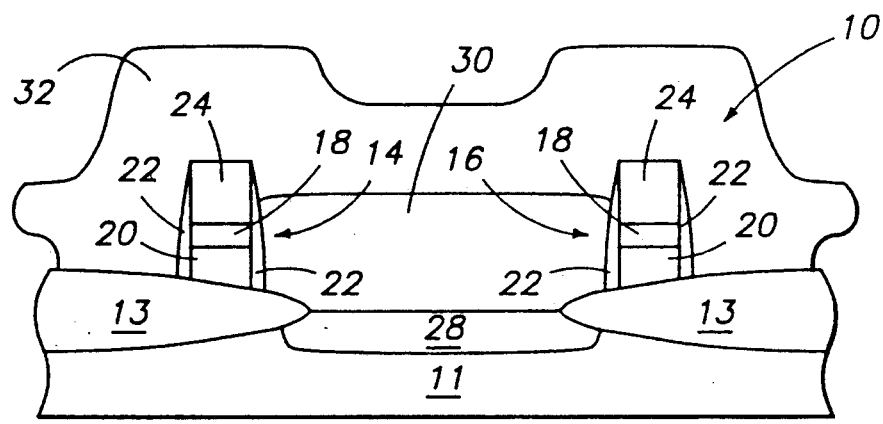
FIGS. 9, 10 and 11 correspond with FIGS. 6, 7 and 8 respectively, and diagrammatically illustrate a substrate wafer at a further subsequent processing step using a processing method in accordance with the invention.
Figure 10:
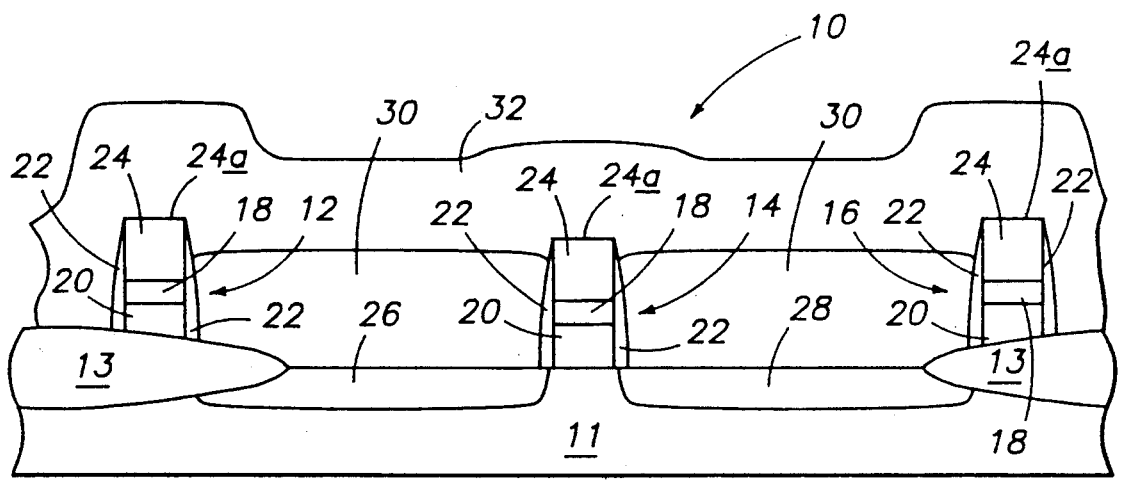

Referring to FIGS. 9, 10 and 11, a layer of electrically insulating material in the form of SiO$_2$ is provided atop the wafer. Layer 32 has its lowest height higher than the height of the uppermost position of silicon plugs 30.

Figure 13:
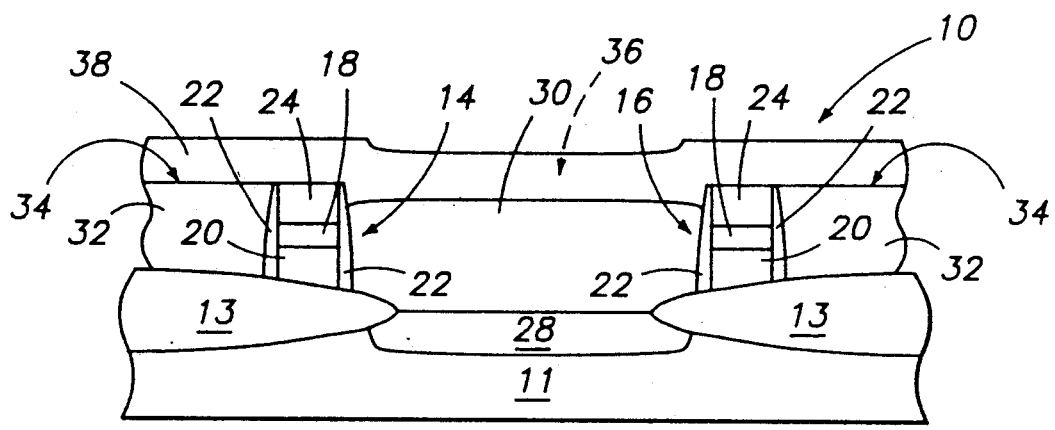
FIG. 13 is a partial diagrammatic section taken through line 13—13 in FIG. 12.
Figure 14:
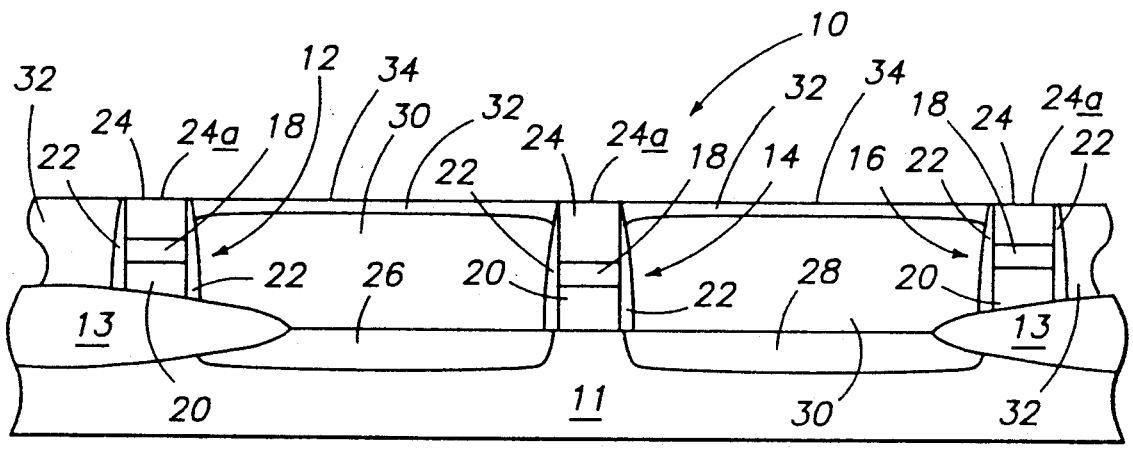
FIG. 14 is a partial diagrammatic section taken through line 14—14 in FIG. 12.
Figure 15:
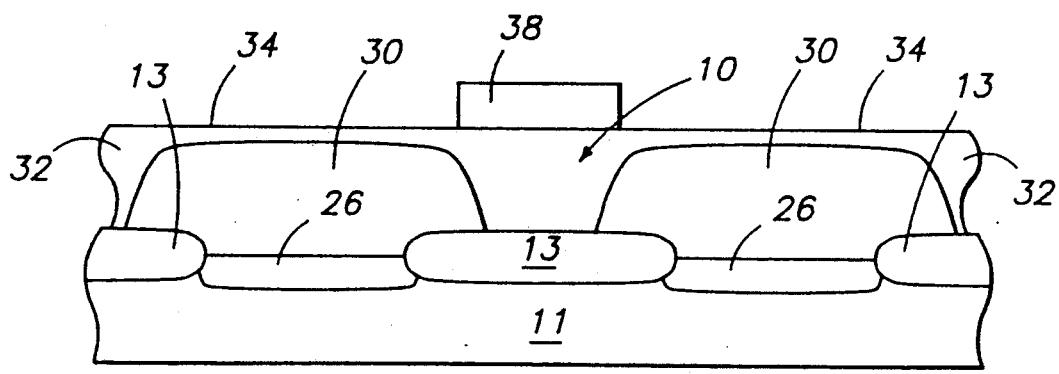
FIG. 15 is a full diagrammatic section taken through line 15—15 in FIG. 12.

Next referring the FIGS. 12-15, oxide layer 32 is planarized (i.e. a certain amount of the material is removed) to provide a substantially planar upper surface 34 of insulating material (FIGS. 13-15). The electrically insulating layer is planarized to a height or position which is substantially coincident with a now common height of uppermost portions 24a of electrically insulated top regions 24 of the word lines. In the course of this planarization step, portions of insulated tops 24 may be removed as well to provide a flat or planar surface of oxide which is coincident with the uppermost portions of tops 24a.

Planarization could be accomplished by a numer of methods, such as mechanically polishing by a dry or slurry polishing method. Alternately, a layer of photoresist could be applied atop oxide layer 32 to provide a planar upper surface, and then the photoresist and oxide etched under conditions which etch these materials at a same rate to a desired end point which provides a flattened planar upper surface.

Next, vias 36 (FIG. 12) are etched into electrically insulating layer 32 to self align with selected plugs 30 of the epitaxial silicon. Next, an electrically conductive material, such as doped polysilicon, is deposited atop the etched electrically insulating oxide layer 32. Then, the conductive layer is selectively etched to form desired substantially planar digit lines, such as the illustrated digit line 38. The process would continue in a conventional manner to form stacked capacitor arrays in accordance with a preferred embodiment for producing DRAM chips. The planarized upper layer facilitates depositing and etching subsequent poly and other layers.

The method provides a distinct advantage of providing improved dies with planarized digit lines having significantly reduced resistance and parasitic capacitance, thus improving the overall performance of the finished product.

In compliance with the statue, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of forming digit lines on a semiconductor wafer having integrated circuits, the method comprising the following consecutive steps:

selectively processing the wafer to produce a desired array of dynamic random access memory cells having associated word lines and having exposed active areas, the word lines being defined by electrically conductive regions comprised of a polysilicon/high conductive material sandwich structure and having side and top electrically insulated regions comprised of oxide;

providing a layer of doped epitaxial monocrystalline silicon atop exposed active areas to a height which is everywhere below the uppermost portions of the electrically insulated regions atop the word lines, and everywhere above the height of the uppermost portions of the word line electrically conductive regions;

providing a layer of an electrically insulating oxide atop the wafer, the electrically insulating layer having a lowest height which is higher than the height of the doped epitaxial silicon layer;

planarizing the electrically insulating layer by removing electrically insulating material to provide a substantially planar upper layer of electrically insulating material at a height which is substantially coincident with a common height of the uppermost portions of the tops of the electrically insulated regions of the word lines;

etching vias into the electrically insulating layer which generally align with doped epitaxial silicon;

depositing an electrically conductive doped polysilicon layer atop the planarized and etched electrically insulating oxide layer; and etching the doped polysilicon layer to form desired substantially planar digit lines.

* * * * *